United States Patent [19]

Wihl

[11] Patent Number: 4,633,504
[45] Date of Patent: Dec. 30, 1986

[54] AUTOMATIC PHOTOMASK INSPECTION SYSTEM HAVING IMAGE ENHANCEMENT MEANS

[75] Inventor: Mark J. Wihl, Tracy, Calif.

[73] Assignee: KLA Instruments Corporation, Santa Clara, Calif.

[21] Appl. No.: 625,903

[22] Filed: Jun. 28, 1984

[51] Int. Cl.⁴ ............................................. G06K 9/40
[52] U.S. Cl. ................................... 382/54; 356/237; 356/390; 358/106
[58] Field of Search ................ 356/390, 237; 364/725; 382/54, 42, 50; 358/106

[56] References Cited

U.S. PATENT DOCUMENTS

| | | | |
|---|---|---|---|
| 4,223,346 | 9/1980 | Neiheisel et al. | 358/106 |
| 4,247,203 | 1/1981 | Levy et al. | 356/390 |
| 4,330,833 | 5/1982 | Pratt et al. | 382/42 |
| 4,347,001 | 8/1982 | Levy et al. | 356/390 |
| 4,398,256 | 8/1983 | Nussmeier et al. | 382/54 |
| 4,448,532 | 5/1984 | Joseph et al. | 356/237 |
| 4,454,542 | 6/1984 | Miyazawa | 358/106 |
| 4,472,738 | 9/1984 | Hada et al. | 356/237 |
| 4,532,650 | 7/1985 | Wihl et al. | 358/106 |
| 4,561,104 | 12/1985 | Martin | 382/50 |

OTHER PUBLICATIONS

Mitra et al, *IEEE Trans. in Acoustics, Speech & Signal Processing,* vol. ASSP-26, No. 6, Dec. 1978, "A New Realization Method for 2-D Digital Transfer Functions".

"Programming a Z-Transform", *Sampled Data-Control,* Sep. 19, 1962.

*Primary Examiner*—Leo H. Boudreau
*Assistant Examiner*—Jose L. Couso
*Attorney, Agent, or Firm*—Hamrick, Hoffman, Guillot & Kazubowski

[57] ABSTRACT

Optical inspection apparatus for detecting defects in a visually perceptible pattern including image acquistion means for inspecting the pattern on a pixel-by-pixel basis, developing digital data signals corresponding to each pixel and feeding the signals so developed to an imaging enhancement means. The imaging enhancement means compensates for equipment related degradations in the images and converts the digital data signal value corresponding to each pixel into a corrected signal value by operating on the digital data signal with a two dimensional finite impulse response filter. The corrected signal values of the image enhancement means are received by a defect detection means which evaluates the signal values for defects in the pattern. Any defects so determined are recorded and/or displayed on data recording means.

7 Claims, 5 Drawing Figures

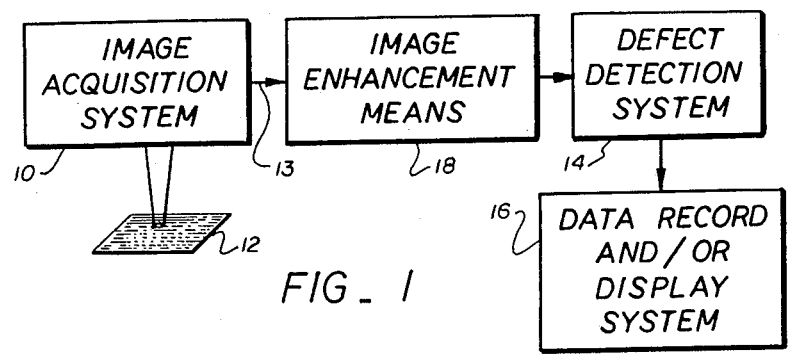
FIG_1
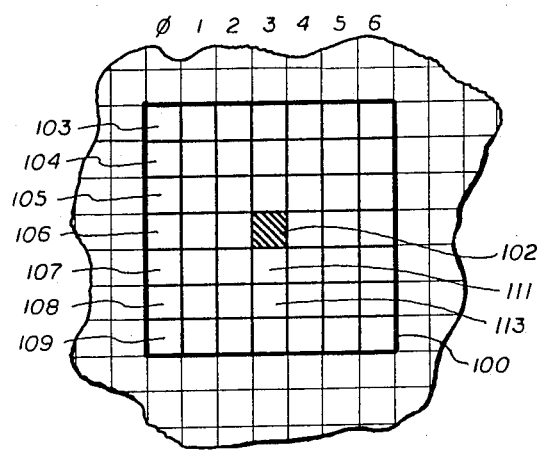
FIG_3

WHERE:
$$P(Z_x, Z_y) = \sum_{i=\phi}^{6} \sum_{j=\phi}^{6} C_{i,j} Z_x^{-j} Z_y^{-i}$$

DUE TO R-L SYMMETRY
$$C_{i,j} = C_{i,6-j} : \phi \leq i \leq 6, \phi \leq j \leq 3$$

DUE TO T-B SYMMETRY
$$C_{i,j} = C_{6-i,j} : \phi \leq i \leq 3, \phi \leq j \leq 6$$

AUTOMATIC PHOTOMASK INSPECTION SYSTEM HAVING IMAGE ENHANCEMENT MEANS

BACKGROUND OF THE INVENTION

1. Field of the Invention

The present invention relates generally to object inspection apparatus and more particularly, to the use of a digital image enhancement means in an automatic photomask inspection system of the type used to locate extremely small defects in the transparencies of a photomask used to manufacture semiconductor devices.

2. Reference to Related Applications

This application is related to the subject matter disclosed in and claimed in U.S. Pat. No. 4,247,203, entitled "Automatic Photomask Inspection System and Apparatus"; U.S. Pat. No. 4,347,001, entitled "Automatic Photomask System and Apparatus"; U.S. patent application entitled "Automatic System And Method For Inspecting Hole Quality", Ser. No. 505,848, filed June 24, 1983; U.S. patent application entitled "Reticle Inspection System", Ser. No. 474,461, filed Mar. 11, 1983; U.S. patent application entitled "Photomask Inspection Apparatus And Method With improved Defect Detection", Ser. No. 492,658, filed May 8, 1983; and U.S. patent application entitled "Photomask Inspection Aparatus And Method Using Corner Comparator Defect Detection Algorithm", Ser. No. 494,762, filed May 12, 1983.

3. Discussion of the Prior Art

One of the major sources of yield loss in the manufacture of large scale integrated circuits (LSI) is random defect in the photomasks that are used to photolithigraphically manufacture the devices. Discussions of prior art problems and solutions therefor are fully disclosed in the above-identified patents and pending applications and such information is expressly incorporated herein by reference.

As inspection requirements become more demanding, e.g. requiring recognition of smaller features, detection of smaller defects, and capacity to handle higher geometry densities, successful inspection becomes contingent upon being able to operate at or near the physical limits of optical systems. For example, in order to guarantee that the system will "see" a very small defect, there must be sufficient gain through the optics and image acquisition system over a sufficiently wide band of spatial frequencies so as to provide modulation to the defect which exceeds a worst case noise threshold. The shape of the Modulation Transfer Function of the optics is determined by the limiting Numerical Aperture (N.A.) of the optical system and the mean wavelength and degree of coherency of the light used. Increasing the Numerical Aperture increases the optical bandwidth; however, it is at present extremely difficult to significantly increase the N.A. beyond the presently used 0.85 while otherwise maintaining acceptable performance. Immersion objectives can achieve higher useful N.A.'s but their use is unacceptable in this application due to the risk of introducing contaminant to the sample. Decreasing the wavelength of the light increases the bandwidth of the optics; however, the sensitivity of silicon photodiodes begins to fall rapidly at wavelengths significantly shorter than the presently used 540 nm. Other forms of photo-detectors do not offer the speed, sensitivity and high number of elements available with silicon photodiodes. Increasing the coherency of the light used can increase the optical gain at low and moderate frequencies but this also has its costs. With increased coherency comes decreased optical bandwidth, increased probability of fringing and decreased validity in treating the system as linear in intensity. Given these constraints and the need for improved modulation to small defects, non-optical techniques of modifying the system Modulation Transfer Function were explored.

4. Discussion of Solution Theory

The present invention seeks to obtain a solution by recognizing the mechanisms by which the image is degraded and then by operating on the degraded image with a digital filter so as to restore it to a substantially undegraded form. For example, in the automatic photomask inspection systems to which the invention is presently applied the degradations are due to the non-zero width of the optics point spread function, the blurring which results as a function of sampling the image on the fly, and the non-zero coupling between adjacent sensor sites on the photodiode arrays. The comdined effect of these factors may be mathematically represented in the space domain as the convolution of the undegraded image with a 2-dimensional blurring function; or, in the frequency domain as the product of the fourier transform of the undegraded image multiplied by the fourier transform of the 2-D blurring function. If a filter is introduced whose transfer function is equal to the inverse of the fourier transform of the 2-D blurring function the data at its output would represent the undegraded image. In practice the filter function must deviate from this ideal so as to maintain adequate signal-to-noise ratio at its output given finite signal-to-noise ratio at its input and finite precision on the mathematical operations carried on by the hardware. Although the ideal cannot be achieved practically, it has been demonstrated that this technique provides the necessary improvements in modulation to smaller defects to allow them to be detected reliably.

It is important to note that although the filter function may be combined with the defect detection function, the separation in hardware of these functions greatly reduces the complexity of the hardware involved and allows greater flexibility in matching the hardware performance to variations in other system performance parameters.

In the present embodiment, the filter function is accomplished through the use of a 7×7 Finite Impulse Response filter. This filter produces a corrected pixel of output as the weighted sum of each pixel of input and its nearest 48 neighbors. Although the filter is implemented in hardware so as to achieve very high data rates, the weightings, or coefficients, may be changed by the system software to adapt the filter to changes in other system performance parameters. Due to circular symmetry of the optics point spread function, left-right symmetry of the motion blurring, and top-bottom symmetry of the photodiode coupling phenomenon, the 2-D blurring function and correspondingly the coefficients of the inverse filter function exhibit top-bottom and left-right symmetry as well. The present implementation takes advantage of this symmetry by combining mathematical operations which could not otherwise be combined and consequently results in a reduction in hardware complexity.

SUMMARY OF THE PRESENT INVENTION

It is therefore a primary objective of the present invention to provide a means for enhancing the digital image data acquired by an image acquisition system so that the subsequent defect detection system can perform its function on data that more nearly corresponds to the features of the object being inspected.

Another object of the present invention is to provide a means of the type described wherein digital filter techniques are used to provide enhancement and restoration of the digital image data.

Briefly, in accordance with the present invention, image enhancement means in the form of a finite impulse response filter are included within the signal stream of an automatic photomask inspection system between the image acquisition subsystem and the defect detection subsystem. The filter is designed to compensate for degradations caused by the system optics, degradations caused by movement of the object relative to the system optics, and by signal overlap between adjacent elements of the photosensitive detector array.

An imporatnt advantage of the present invention is that since the binary data representing the image is considerably more accurate than that which would otherwise be presented to the defect detection subsystem, the detection subsystem need not include features dedicated solely to a compensation for errors which are known to appear in the data. Consequently, the detection of smaller defects is more accurately accomplished and the likelihood of system error is substantially reduced.

These and other objects of the present invention will no doubt become apparent to those skilled in the art after having read the following detailed description of a preferred embodiment which is illustrated in the several certain figures of the drawing.

IN THE DRAWING

FIG. 1 is a block diagram generally depicting the overall components of a photomask inspection system in accordance with the present invention;

FIG. 3 is a pixel diagram used to pictorially represent the manner of operation of the preferred embodiment;

DETAILED DESCRIPTION OF THE PREFERRED EMBODIMENTS

Figure 2:
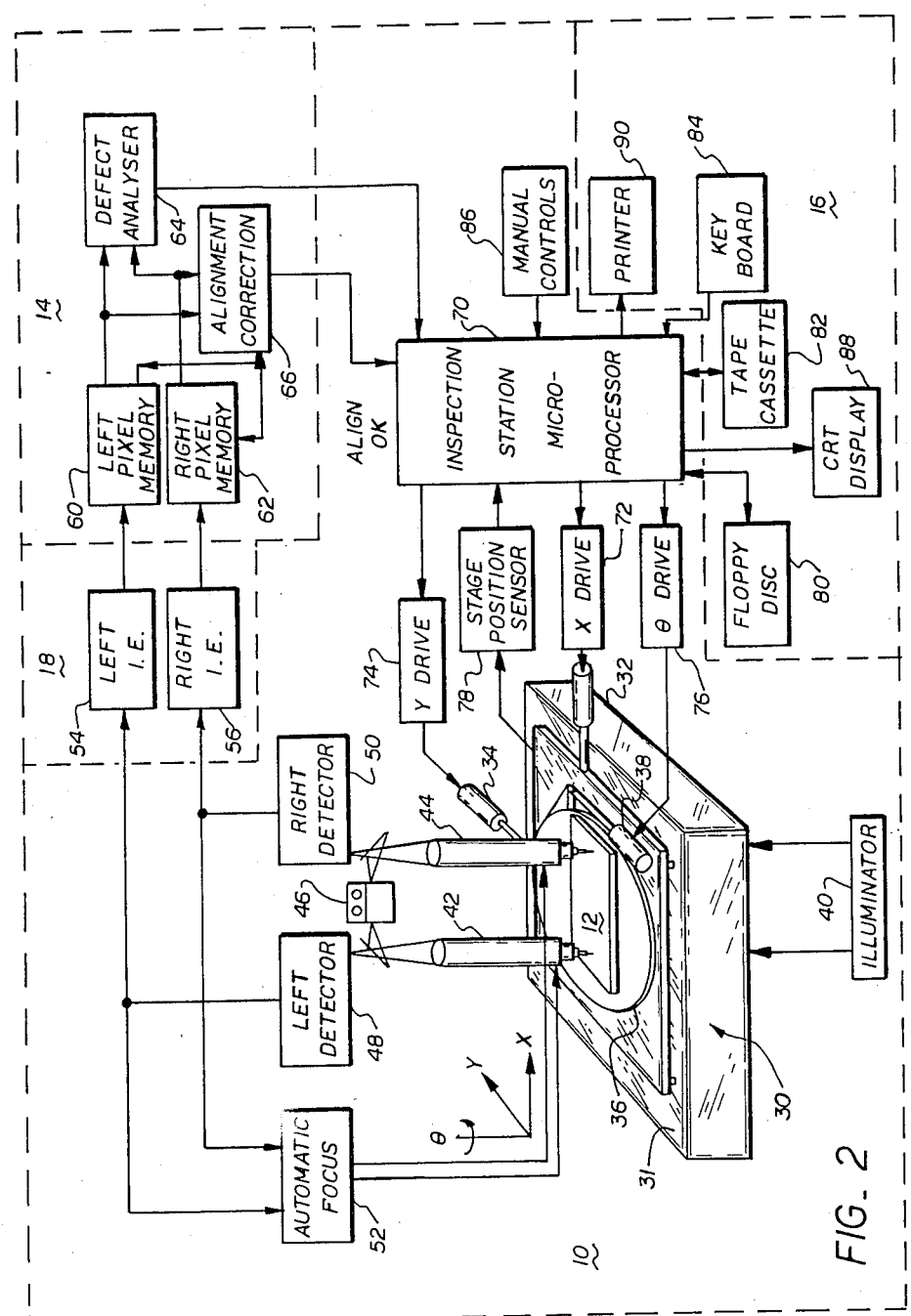
FIG. 2 is a more detailed block diagram illustrating a particular embodiment of an automatic photomask inspection system in accordance with the present invention.

Referring now to FIG. 1 of the drawing, a generalized block diagram is depicted to set the stage for a detailed description of a preferred embodiment of the repsent invention. It is to be appreciated, however, that the present invention is not limited to the depicted embodiment and will have broad application to other types of systems used to perform similar or related types of inspection. As generally set forth, an image acquisition subsystem 10 is incorporated for optically inspecting an object 12 having extremely small features that must be inspected. It will be appreciated that due to the electrical, optical and mechanical limitations of the system 10, the signals output at 13 will be variously degraded in a manner which can be predetermined through a detailed analysis of the system.

In the usual image inspection system, the signals output at 13 are fed directly into a defect detection subsystem such as is shown at 14 and various types of algorithms are used to interpret degraded data and detect defects appearing therein. The resultant output is thereafter recorded and/or displayed by a subsystem such as is illustrated by the block 16.

In accordance with the present invention, an image enhancement means 18 is interposed in the signal stream between the image acquistion subsystem 10 and the defect detection subsystem 14 so as to compensate for equipment related degradations in the image.

Turning now to FIG. 2 of the drawing, a more detailed block diagram is illustrated of an actual automatic photomask inspection system incorporating image enhancement means according to the present invention. Although more complete descriptions of such a system and alternatives thereof may be found in the above-referenced patents and pending applications for patent, the following brief description of the diagram of FIG. 2 will acquaint the reader generally with the principal component parts of such a system. In the illustrated embodiment of FIG. 2, the functional blocks shown in FIG. 1 are outlined in dashed lines with common designation.

More specifically, the various functional components of this system are schematically illustrated and include an air bearing stage 30 mounted on a granite table 31 for transporting a mask 12 to be inspected. Stage 30 is moveable in the X and Y directions by motors schematically illustrated at 32 and 34, respectively, and the mask holder portion 36 of the stage 30 is rotatable about the 0 axis by a motor 38.

Disposed beneath the granite table 31 is an illuminator system 40 which illuminates the bottom of mask 12 through an opening therein. Left-hand and right-hand inspection optics are illustrated at 42 and 44, respectively, and cast images of the inspected die onto a binocular view-head 46 as well as onto left and right detectors 48 and 50. The optical systems 42 and 44 are automatically focused by a means illustrated at 52. The data output from the detectors 48 and 50 is input to left and right image enhancement systems 54 and 56, respectively, which compensate for degradations in image quality caused by subsystem 10, and corrected or "filtered" image data in digital form is output to the left pixel memory 60 and the right pixel memory 62, respectively. The data stored in the respective memories is subsequently compared by a defect analyzer 64 to provide defect detection signals which are input to the microprocessor 70.

In order to electronically provide alignment correction of the two die images, a fine alignment correcting system 66 is also utilized. Movement of the airbearing stage 30 is controlled by the microprocessor 70 which energizes X, Y and 0 drive systems 72, 74 and 76, respectively, in response to program instruction, manual inputs from manual controls 86 and data received from the stage position sensor means 78. Certain operator controls may be input through a keyboard 84 and data developed by the system may be output for storage to a floppy disk drive 80, a tape cassette drive 82 or a printer 90. Visual display of the inspected die may also be displayed on a CRT display unit 88.

In order to briefly explain operation of the system illustrated in FIG. 2 of the drawing, it must be pointed out that the optical system 42 and 44 cast an optical image onto arrays of photodetectors which are 1 detector wide and 512 detectors long. The output of each photodetector in the array is then digitized and input into the image enchancement means 54 and 56, respectively, wherein the signals are in effect buffered up in pixel form and viewed as a 7×7 pixel array 100 (see FIG. 3) centered about the pixel of interest 102. It will be appreciated that by evaluating each pixel 102 based not only upon its actual detected value but also upon the effect of the surrounding 48 other adjacent pixels, very accurate image detection can be accomplished. However, as pointed out above, the detected data representing each pixel of the 7×7 array is subject to degradations due to the less than ideal operation of the image acquisition system 10.

As further indicated above, the purpose of the left and right image enhancment subsystems 54 and 56 is to correct the data and reconstruct it as close as possible to its actual values. Recognizing that when the optics blur an image, they do so by convolving the circularly symmetric optical point spread function with the image, the enhancement filters must also be 2-dimensional. Furthermore, recognizing that a certain amount of blurring is caused by movement of the stage that is transporting the image past the detection optics, it will be appreciated that such a degradation is in a single direction normal to the longitudinal axis of the 1×512 array of photodetectors (not shown). It will further be appreciated that whereas the stage motion blur is in one orthogonal direction, the sensor coupling error from one photodiode to another is in the other orthogonal direction. Accordingly, since the combined effect of these sources of degradation is a 2-dimensional blurring, a 2-dimensional filter will be required to reconstruct the image data. It should also be apparent that the combined effect of these phenomena will be left-right and top-bottom symmetric.

If one were to determine the spacial effect of the above-mentioned degradations on a particular pixel attributable to each of the 48 surrounding pixels and then overlay the pixel matrix by a 7×7 correction coefficient matrix, a summation of the products of each coefficient times its corresponding pixel would yield a value which would more accurately represent the data value of the pixel 102. Accordingly, one embodiment of an image enhancement means might directly implement such a filter. However, recognizing the symmetry involved, the number of products taken may be reduced to 16 given that pixels symmetrically located about the center are previously summed.

Figure 4:
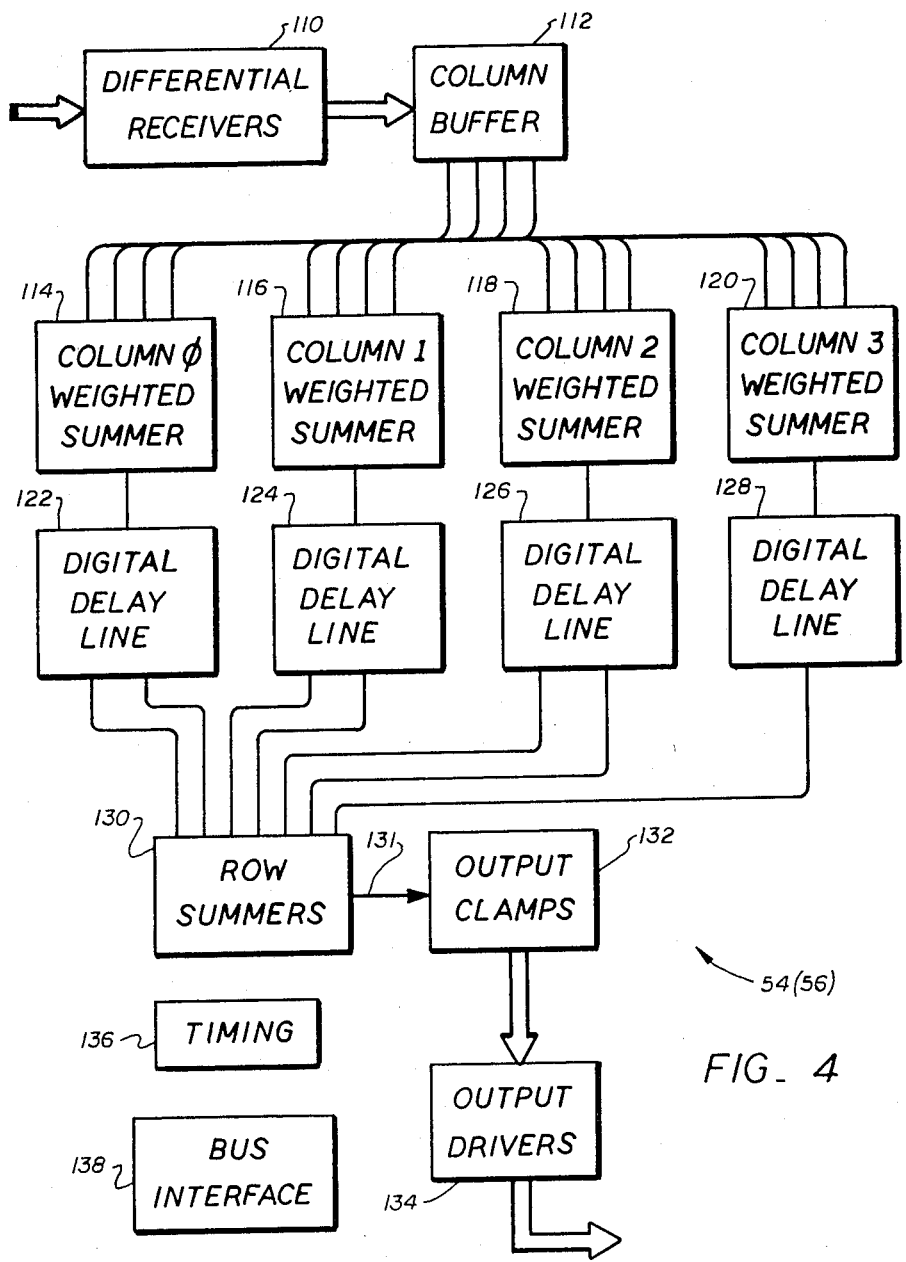
FIG. 4 is a block diagram schematically illustrating the functional components of the subject image enhancement means.

One such implementation is illustrated in block diagram form in FIG. 4 of the drawing. According to this diagram, which represents one of the image enhancement devices 54 and 56 shown in FIG. 2, differential receivers 110 receive the output from the detectors 48 (50) and, after effecting appropriate level translation, input the signal data into a column buffer 112 which allows the pixels 103-109 (FIG. 3) to be operated on as a group. Since the 7×7 matrix has top-bottom symmetry, it will be appreciated that the filter coefficient of pixel 103 will be equal to that of 109, the filter coefficient of pixel 104 will be equivalent to that of 108, and similarly, the filter co-efficient of pixel 105 will be the same as that of 107. Pixel 106 is the middle-most pixel in the first, or 0, column. Buffer 112 adds up the pixel values 103 plug 109 and outputs the sum, adds up 104 and 108 and outputs the sum, adds up 105 and 107 and outputs the sum and outputs the value of 106. These four values are then input to four column weighted summer circuits 114-120 each of which contains four coefficients. The four column weighted summers correspond to the four unique columns of the coefficient matrix. The four coefficients contained within each column weighted summer correspond to the four unique coefficients within the associated column. Each column weighted summer multiplies the four sums input to it by the appropriate coefficients and then sums these products. The outputs of the four column weigthed summers therefore represents the contributions to all future filter outputs due to the 7 pixels presently in the column buffer.

Recognizing that one vertical line time after the column 0 data has been output from column buffer 112, data corresponding to column 1 (FIG. 3) will appear in buffer 112, and one clock period later column two will appear in 112, etc. It will be appreciated that by utilizing appropriately configured delay lines 122-128, the four sums output by summers 114-120, will result in all of the data corresponding to matrix 100 appearing at the output taps of the delay lines. As a result, for each clock period, two row sums corresponding to rows 0 and 6 will be output from delay line 122, two row sums corresponding to columns 1 and 5 will be output from delay line 124, and two row sums corresponding to rows 2 and 4 will be output from delay line 126, and the sum of row 3 will be output by delay line 128. These sums are then in turn summed together by a row summer 130 to develop on line 131 a composite signal which corresponds to the filtered value of pixel 102. This signal is then fed into an output clamp 132 which ensures that no signal exceeds predetermined upper and lower limits, and the clamped output is then fed into output drivers 134 which feed it into subsequent memory of the defect detection subsystem 14. Along with this circuit is included appropriate timing circuitry 136 and a bus interface 138 which allows the setting and/or adjustment of the coefficients of the summers 114-120.

Figure 5:
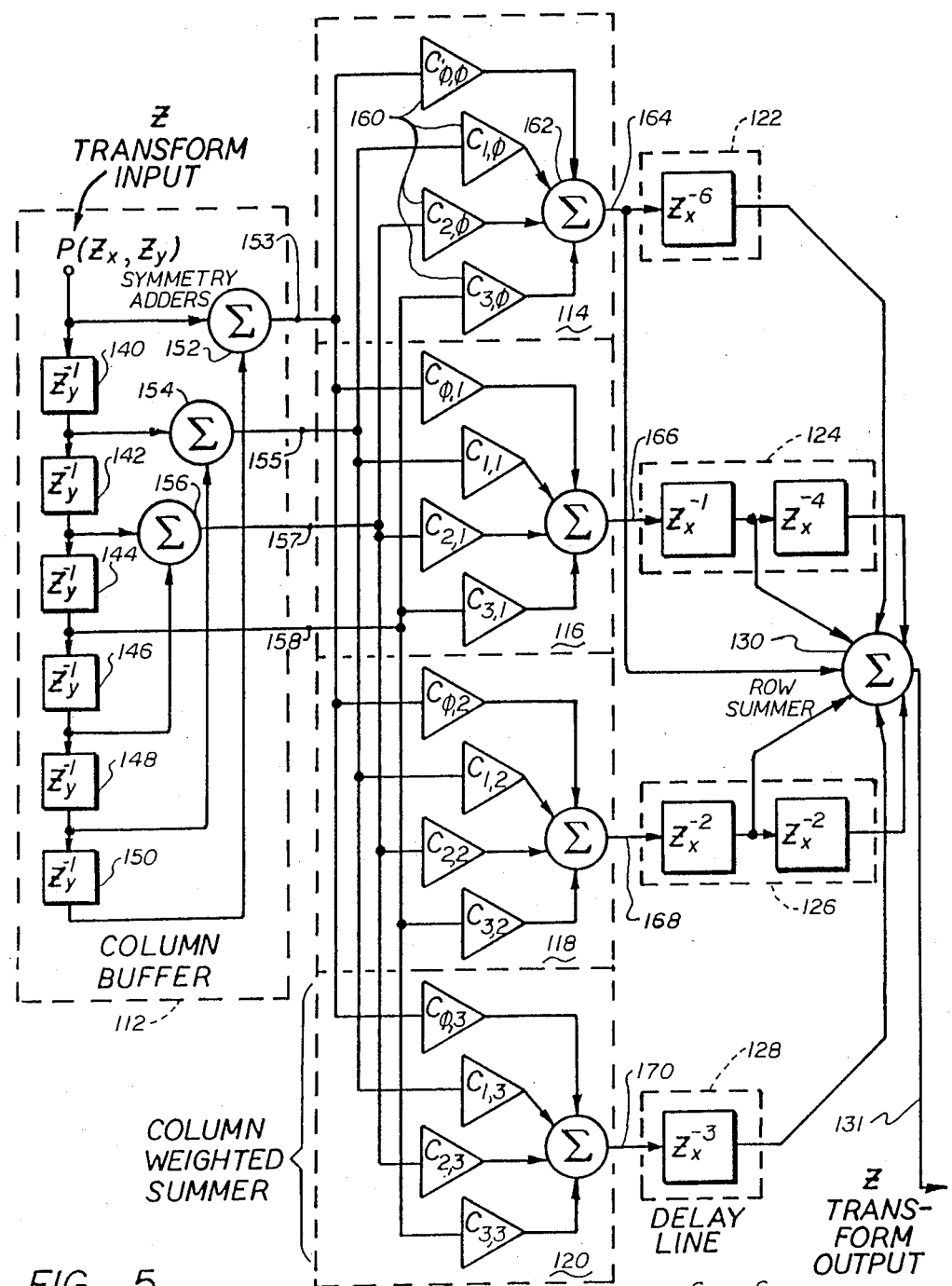
FIG. 5 is a diagram schematically depicting the logic by which one embodiment of the filter function is accomplished.

To further explain a particular embodiment of the invention illustrated in block diagram form in FIG. 4, reference is made to the Z-transform diagram illustrated in FIG. 5. As indicated, column buffer 112 includes six concatinated one pixel delay lines 140-150 and three symmetry adders 152-156. If, for example, the data corresponding to the pixels in row 0 of FIG. 3 is input to buffer 112 so that data corresponding to pixel 109 occupies delay line 150, data of pixel 108 occupies delay line 148 and so forth, it will be apparent that the data corresponding to pixels 103 and 109 will be summed by the symmetry adder 152 and output on line 153, the data in pixels 104 and 108 will be stored in delay lines 140 and 148, will be summed by symmetry adder 154 and will be output on line 155, and the data corresponding to pixels 105 and 107 will be contained in delay lines 142 and 146 and will be summed by symmetry adder 156 and output on line 157. The pixel data corresponding to pixel 106 is stored in delay line 144 and output on line 158.

These sums are then input to each of the four column weighted summers 114-120 which include four amplifiers 160, each of which has a gain corresponding to one of the 16 unique coefficients. In addition, each summer unit includes adder 162 which adds the pixel products input thereto and outputs a signal corresponding to each of the four sums on lines 164, 166, 168 and 170, respectively.

The output signals developed on lines 164-170 are then input to the six sensor scan delay line 122, the one sensor scan and four sensor scan delay line 124, the two concatinated two scan delay line 126 and the one scan delay line 128. It will thus be appreciated that following the appearance of data from column six in the column buffer 112, the data appearing at the several delay line taps illustrated will correspond to the sums of the values for each pixel row in the 7×7 matrix and the summed output appearing on line 131 will be equivalent to the filtered value of pixel 102. Similarly, during the following clock period the signal appearing on line 131 will correspond to the pixel 111, the next signal will correspond to pixel 113, etc.

It will thus be appreciated that by passing all of the data output by detector 48 and detector 50 through the image enhancement circuits 54 and 56, respectively, the data stored in pixel memory units 60 and 62, respectively, will much more accurately represent the pattern information on the photomask 12, and the defect analyzer 64 will be able to perform its analysis function with much greater accuracy and facility.

Although the present invention has been disclosed hereinabove with regard to a single preferred embodiment utilizing a finite impulse response filter, it is to be understood that the image enhancement operation could be performed using other types of ditial filters implemented in many different ways each of which is consistent with the present invention but none of which depart from the inventive concept. Accordingly, it is intended that the following claims cover all embodiments of image enhancement circuit and techniques as fall within the true spirit and scope of the invention.

What is claimed is:

1. Optical inspection apparatus for detecting defects in a visually perceptible pattern, comprising:
   image acquisition means for inspecting said pattern on a pixel-by-pixel basis and developing digital data signals corresponding to each pixel thereof;
   image enhancement means for converting the digital data signal value corresponding to each said pixel into a corrected signal value by operating on said digital data signal with a two dimensional digital finite impulse response filter means, the spacial coefficients of which are selected to inversely correspond to measurable degradation inherent in said image acquisition means, whereby each said corrected signal value is more closely representative of the actual pixel data than is the corresponding input digital data signal value, said filter means including
       column buffer means for outputting pixel data signals corresponding to the data contained in each column of an n×n array of pixel data surrounding a pixel inspected by said image acquisition means,
       column weighted summer means for multiplying each said pixel data signal in a particular column of said array by predetermined co-efficients corresponding to the position of the pixel data in said array and for adding the products thereof of each said column to form n column data signals,
       delay line means for time delaying in a predetermined manner the said n column data signals, and
       row summation means for summing the said n column data signals to develop an enhanced data signal representing the said inspected pixel;
   defect detection means for receiving said corrected signal values and determining whether or not defects appear in said pattern; and
   data recording means for recording and/or displaying any defects detected by said defect detection means.

2. Optical inspection apparatus as recited in claim 1 wherein the Z-transform of said finite impulse response filter means is expressed as $$P(Z_x, Z_y) = \sum_{i=0}^{n-1} \sum_{j=0}^{n-1} C_{i,j} Z_x^{-i} Z_y^{-j}$$

where
   n is an odd integer,
   $C_{i,j}$ identifies a particular pixel coefficient in an n×n matrix of pixel coefficients, and
   due to right-to-left symmetry $$C_{i,j} = C_{i,(n-1)-j}$$

$$0 \leq i \leq (n-1), 0 \leq j \leq (n-1)/2$$

and due to top-to-bottom symmetry $$C_{i,j} = C_{(n-1)-i,j}, 0 \leq i \leq (n-1)/2, 0 \leq j \leq (n-1).$$

3. Optical inspection apparatus as recited in claim 1 wherein the said co-efficients of said n×n array are symmetric about two orthogonal axes and wherein said column buffer means includes means for temporarily storing the n pixel data signals in a column of said array, and further includes a plurality of symmetry adder means for adding together the corresponding pixel data signals on each side of the mid-point thereof to develop a plurality of summed symmetric pixel data signals, and wherein said column weighted summer means includes four column weighted summer networks each having a plurality of predetermined coefficients for multiplying each of said summed symmetric pixel data signals, and each said network includes means for summing the products thereof to develop various ones of said n column data signals.

4. Optical inspection apparatus for detecting differences between two like objects, comprising:
   carriage means for supporting the objects to be inspected and for simultaneously moving such objects along an inspection path;
   illuminator means for illuminating corresponding portions of said objects as they are moved along said path;
   electro-optical means for individually inspecting said illuminated portions and for developing first and second electrical signals respectively corresponding to said illuminated portions, said first and second electrical signals including error components reflective of limited electrical, mechanical and optical performance of said electro-mechanical optical means, said first and second electrical signals being in the form of a stream of digital data signals each corresponding to the image content of a pixel of the inspected objects;
   image enhancement means for receiving said first and second electrical signals and for substantially decreasing said error components and developing first and second improved electrical signals by converting the signal values corresponding to each said pixel into a corrected signal value determined by collectively considering the data values of adjacent pixel values multiplied by predetermined coefficients selected to compensate for said error components, said image enhancement means including column buffer means for outputting pixel data signals corresponding to the data contained in each column of an n×n array of pixel data surrounding a pixel inspected by said image acquisition means, column weighted summer means for multiplying each said pixel data signal in a particular column of said array by predetermined coefficients corresponding to the position of the pixel data in said array and for adding the products thereof of each said column to form n column data signals, delay line means for time delaying in a predetermined manner the said n column data signals, and row summation means for summing the said n column data signals to develop an enhanced data signal representing the said inspected pixel.

5. Optical inspection apparatus as recited in claim 4 wherein said image enhancement means includes finite impulse response filter means, the spacial coefficients of which are selected to inversely correspond to said error components.

6. Optical inspection apparatus as recited in claim 4 wherein said image enhancement means is a finite impulse response filter means the Z transform of which is expressed as $$P(Z_x, Z_y) = \sum_{i=0}^{n-1} \sum_{j=0}^{n-1} C_{i,j} Z_x^{-j} Z_y^{-i}$$

where
n is an odd integer,
$C_{i,j}$ identifies a particular pixel coefficient in an n×n matrix of pixel coefficients, and due to right-to-left symmetry $$C_{i,j} = C_{i,(n-1)-j} \quad \phi \leq i \leq (n-1), \phi \leq j \leq (n-1)/2$$

and due to top-to-bottom symmetry $$C_{i,j} = C_{(n-1)-i,j} \quad \phi \leq i \leq (n-1)/2, \phi \leq j \leq (n-1).$$

7. Optical inspection apparatus as recited in claim 4 wherein the said coefficient of said n×n array are symmetric about two orthogonal axes and wherein said column buffer means includes means for temporarily storing the N pixel data signals in a column of said array, and further includes a plurality of symmetry adder means for adding together the corresponding pixel data signals on each side of the mid-point thereof to develop a plurality of summed symmetric pixel data signals, and wherein said column weighted summer means includes four column weighted summer networks each having a plurality of predetermined coefficients for multiplying each of said summed symmetric pixel data signals, and each said network includes means for summing the products thereof to develop various ones of said n column data signals.

* * * * *